United States Patent [19]
Szente et al.

[11] Patent Number: 5,204,614
[45] Date of Patent: Apr. 20, 1993

[54] BROAD-BAND MICROWAVE POWER SENSOR USING DIODES ABOVE THEIR RESONANT FREQUENCY

[75] Inventors: Pedro A. Szente, Los Altos; Gratz L. Armstrong, Sunnyvale, both of Calif.

[73] Assignee: Hewlett-Packard Company, Palo Alto, Calif.

[21] Appl. No.: 744,858

[22] Filed: Aug. 14, 1991

[51] Int. Cl.$^5$ .................. G01R 23/04; H01P 5/12; H01P 5/18; H01P 1/00
[52] U.S. Cl. ................ 324/95; 324/652; 333/113; 333/250
[58] Field of Search ........... 333/248, 250, 113; 324/95, 637, 638, 652

[56] References Cited

U.S. PATENT DOCUMENTS

| | | | |
|---|---|---|---|
| 3,508,156 | 4/1970 | Webb | 324/95 |
| 3,693,103 | 9/1972 | Mouw | 324/95 |
| 3,932,795 | 1/1976 | Kliphuis | 324/95 |
| 4,259,743 | 3/1981 | Kaneko et al. | 333/250 |
| 4,271,411 | 6/1981 | Takashi | 333/250 |
| 4,465,990 | 8/1984 | Gibson | 329/322 |

FOREIGN PATENT DOCUMENTS

| | | | |
|---|---|---|---|
| 0236623 | 10/1969 | U.S.S.R. | 324/95 |
| 0428297 | 3/1979 | U.S.S.R. | 324/95 |
| 1483389 | 5/1989 | U.S.S.R. | 324/95 |

OTHER PUBLICATIONS

"A Precision Directional Coupler Using Multi-Hole . . .", Barnett et al., Hewlett-Packard Journ., vol. 3, No. 78, Mar.-Apr. 1982.
"Design and Performance of Millimeter-Wave Thermocouple Sensors," Lee H. Colby, Hewlett-Packard Journ., pp. 35-38, Apr. 1988.
"Microelectronics Enhances Thermocouple Power Measurements," by John C. Lamy, Hewlett-Packard Journ., vol. 26, No. 1, pp. 19-23, Sep. 1974.

Primary Examiner—Ernest F. Karlsen
Assistant Examiner—William J. Burns

[57] ABSTRACT

A microwave power sensor is disclosed which is capable of using diodes above their resonant frequency to sense the power of input microwaves. The power sensor includes a sensing diode, a conditioning means, and a tapered waveguide. For input waves having frequencies near and above the resonant frequency of the sensing diode, the output of the diode begins to be frequency dependent. That is, the diode outputs different DC signals for waves having different frequencies even though the power of the waves is the same. The conditioning apparatus is adapted to offset the frequency dependence of the diode by varying the fraction of the input wave that is transmitted to the diode so as to cause the output of the diode to be relatively constant for waves having equal power but different frequencies. The conditioning apparatus also provides a load impedance which matches the characteristic impedance of the input wave to minimize the reflection of the input wave. In addition, the conditioning apparatus attenuates the input signal to ensure that the sensing diode operates in the square law region. The tapered waveguide receives the wave transmitted by the conditioning apparatus and conveys it to the sensing diode. The waveguide is adapted to cause the input wave to have a voltage maximum at its output port. By attaching the sensing diode across the output port of the waveguide, the power sensor is capable of sensing the power of input waves having frequencies over a broad frequency band.

9 Claims, 8 Drawing Sheets

BROAD-BAND MICROWAVE POWER SENSOR USING DIODES ABOVE THEIR RESONANT FREQUENCY

BACKGROUND OF THE INVENTION

This invention relates to microwave power sensors and specifically to a power sensor which utilizes diodes to sense the power of microwaves that have frequencies near and above the resonant frequency of the diodes.

Microwave power sensors have a number of applications in fields ranging from communications to national defense. Power sensors using diodes as the sensing means have been used to measure microwave power for a number of years, but the power sensors of the past could only be used to measure the power of waves having frequencies much below the resonant frequency of the diodes.

To illustrate the concept of a resonant frequency, a commonly accepted model of a diode formed on a semiconductor substrate is shown in FIG. 1. The diode itself is represented by a junction capacitance $C_j$ and a nonlinear resistance $R_o$. The spreading resistance $R_s$ is the resistance encountered by the current as it flows through the bulk of the semiconductor substrate. The lead inductance $L_i$ is the inherent inductance of the electric connection to the diode, and the parasitic capacitance $C_p$ is the capacitance associated with the semiconductor substrate itself found between the two terminals A and B. Due to the reactive elements $C_j$, $L_i$, and $C_p$, there is a certain frequency at which the diode will resonate, and this resonant frequency is determined by the values of these elements. Even with today's fabrication technology, it is only possible to produce diodes having resonant frequencies of as high as about 60 GHz. The resonant frequency of a diode is important because it determines the frequency range within which the diode may usually be used as a power sensor.

A typical power sensing circuit using a diode is depicted in FIG. 2 comprising a matching load resistor $R_m$, a power sensing diode D, and a very large output capacitor $C_o$, the capacitor $C_o$ having a negligible RF impedance. A qualitative plot of the DC output of this sensing circuit against frequency is provided in FIG. 3 for input waves having the same power but different frequencies. For input waves having a frequency much below the resonant frequency of the diode, the impedance of diode D is much greater than $R_m$ so that the input wave 20 encounters a parallel combination of the matching load resistor $R_m$ and a virtual open circuit due to the large impedance of the diode D. As a result, most of the power of the wave 20 is absorbed by the matching resistor $R_m$. The diode D detects the voltage of the input wave 20 at node $N_1$ and rectifies it to produce a DC signal across output capacitor $C_o$ which has an amplitude proportional to the square of the voltage across terminals $T_1$ and $T_2$. Since power is proportional to the square of the voltage, the amplitude of the DC output 22 is thus proportional to the power of the input wave 20. For this reason, the diode is said to be operating under a square law regimen. The DC output curve of the circuit of FIG. 2 for input waves having frequencies much below the resonant frequency of the diode D is depicted by curve portion 24 of FIG. 3. For frequencies below frequency $F_L$, the DC output for input waves having the same power is constant, meaning that there is no frequency dependence. The flatness of curve 24 is quite desirable since the sensor is a power sensor, not a frequency sensor. Waves having the same power should cause the sensor to output the same signal regardless of the frequency of the wave.

For frequencies above $F_L$, however, the DC output is no longer frequency independent as shown by curve 26. This is due to the fact that the diode D of FIG. 2 in reality behaves as the circuit of FIG. 1, which should now replace D in FIG. 2. The DC voltage that appears across the output capacitor $C_o$ really is proportional to the square of the fraction of the input RF voltage wave that appears across the parallel combination of $C_j$ and $R_o$. For frequencies above $F_L$ the diode D behaves very nearly as a series resonant circuit, the resonance being caused mainly by the inductance $L_i$ and the junction capacitance $C_j$. As frequency increases and approaches the resonant frequency of the diode, the voltage across the junction capacitance $C_j$ increases due to the resonance effect, and the DC voltage across the output capacitor $C_o$, which is proportional to the square of the voltage across $C_j$, also increases. Another effect is that, as the frequency of the input signal increases and approaches the resonant frequency of the diode, the diode impedance decreases, causing the parallel combination of its impedance with that of the load $R_m$ to present a mismatched load to the input wave. This process continues as the frequency of the input continues to increase, until the resonant frequency $F_R$ is reached. At this frequency $F_R$, maximum DC output signal across the output capacitor $C_o$ occurs. The diode impedance reaches a minimum at frequency $F_R$. As the frequency of the input signal continues to increase, the RF voltage across the diode junction capacitor $C_j$ starts to drop, and consequently, so does the DC voltage across the output capacitor $C_o$. The DC output of the sensor quickly falls off with increased frequency, as shown by curve portion 28 of FIG. 3. The diode overall impedance begins to rise for frequencies above $F_R$. In regions 26 and 28, the sensing circuit of FIG. 2 is outputting different DC signal levels at different frequencies even though the power of the input wave is constant. This frequency dependence is quite undesirable. A flat response like that of curve 24 would be more preferable, if not essential. Due to this frequency dependence, diodes have seldom been used as power sensors at frequencies near or above their resonant frequencies. As previously mentioned, it is only possible, with current technology, to produce diodes having resonant frequencies of up to about 60 GHz. However, there are many applications which require a power sensor capable of operating at frequencies way above 60 GHz (e.g., between 75 and 110 GHz). Therefore, a need exists for an apparatus which would allow a diode to be used near and above its resonant frequency to measure accurately RF power.

Thus, it is an object of the invention to provide a power sensor which employs a diode to measure accurately the power of electromagnetic waves having frequencies at, near, or above the diode's resonant frequency.

Another object of the invention is to provide a broad-band power sensor which has a relatively flat frequency response up to between 75 and 110 GHz and above.

Yet another object of the invention is to provide a power sensor which has a load impedance which matches the characteristic impedance of the input waveguide.

SUMMARY OF THE INVENTION

In accordance with the objects of the invention, a broad-band electromagnetic wave power sensor is provided which is capable of operating at frequencies near and above the resonant frequency of the sensing diode. The power sensor of the invention comprises a sensing diode, an input wave conditioning means, and a waveguide. The sensing diode of the invention is a diode of regular construction having frequency characteristics such that, for input waves having frequencies near or above its resonant frequency, the ratio of the DC output of the diode to the power of the input wave (DC output/power input ratio) is frequency dependent.

The conditioning means, adapted to receive an input electromagnetic wave and output a conditioned wave having a fraction of the power of the input wave, is designed in such a way that it offsets the frequency dependence of the diode. This may be achieved by designing the conditioning means to transmit a greater fraction of the input wave to the diode at frequencies where the DC output/power input ratio of the diode is below a reference value. Likewise, the conditioning means transmits a lesser fraction of the input wave to the diode at frequencies where the DC output/power input ratio is above a reference value. In this manner, the DC output of the diode may be kept relatively constant for input waves having equal power but different frequencies. The conditioning means is further adapted to have a load impedance which substantially matches the characteristic impedance of the input electromagnetic waveguide so that the conditioning means minimizes the reflection of the input wave. This allows the power of the wave to be measured more accurately. Furthermore, the conditioning means is adapted to attenuate the input signal to a sufficient degree to ensure that the sensing diode functions within the square law region.

The waveguide of the invention receives the conditioned wave outputted by the conditioning means and conveys it to the sensing diode. The sensing diode responds to the conditioned wave by outputting a DC signal which is proportional to the power of the conditioned wave. The sensing diode is preferably attached to the waveguide at a point where a voltage maximum of the conditioned wave always occurs so as to improve the sensitivity of the sensing diode across a broad frequency band.

By combining the conditioning means, waveguide, and diode into a single system, a power sensor may be produced which is capable of providing very nearly constant DC output signals for input waves having equal power but different frequencies. Thus, a broadband power sensor is provided which may be used to measure the power of electromagnetic waves having frequencies near and above the resonant frequency of the sensing diode.

DETAILED DESCRIPTION OF THE INVENTION

Figure 4:
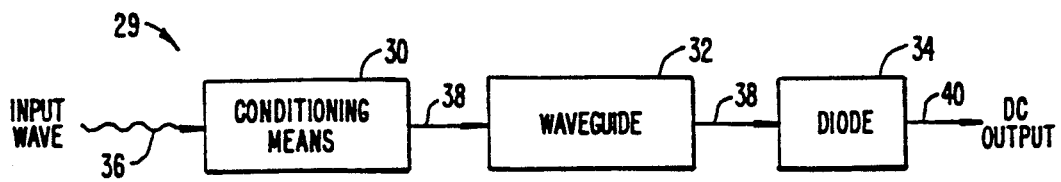
FIG. 4 is a block diagram representation of the basic components of the power sensor of the invention.

A block diagram illustrating the basic components of the power sensor of the present invention is shown in FIG. 4, wherein the sensor 29 comprises a conditioning means 30, a waveguide 32, and a sensing diode 34. The sensor 29 detects the power of an input electromagnetic wave 36 by first having the conditioning means 30 convert the input wave 36 into a conditioned wave 38 having a fraction of the power of the input wave 36. The fraction of the input wave 36 which is transmitted as the conditioned wave 38 is a function of the frequency of the input wave 36. The conditioned wave 38 emerges from the conditioning means 30 and propagates through the waveguide 32 until it reaches the sensing diode 34. In response to the conditioned wave 38, the diode 34 outputs a DC signal 40 having a magnitude which is proportional to the power of the input wave 36. It may seem that the output 40 of the diode is not proportional to the power of the input wave 36 at all, but is instead, an indication of the power of the conditioned wave 38. Although the DC output 40 of the diode 34 is a frequency dependent, non flat function of the power of the conditioned wave 38, the conditioning means offsets the frequency response of the diode 34 in such a way that the power of the input wave 36 may be measured accurately. The manner in which this may be accomplished will be explained in a subsequent section. The specifications and requirements of each of these components, as well as the function of the entire sensor 29, will now be discussed in greater detail.

Sensing Diode

Figure 3:
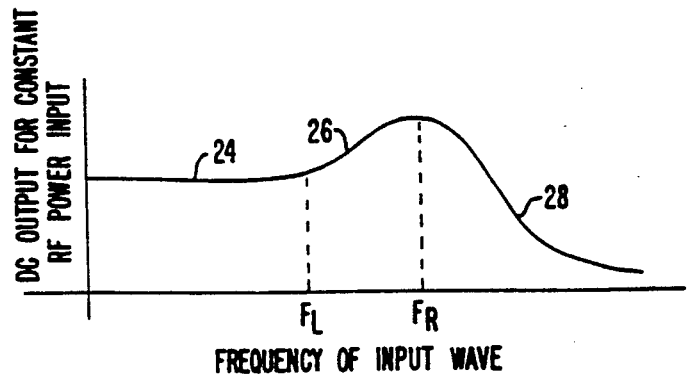
FIG. 3 is a plot of the DC output of the sensing circuit of FIG. 2 with respect to the frequency of input waves equal powers.
Figure 5:
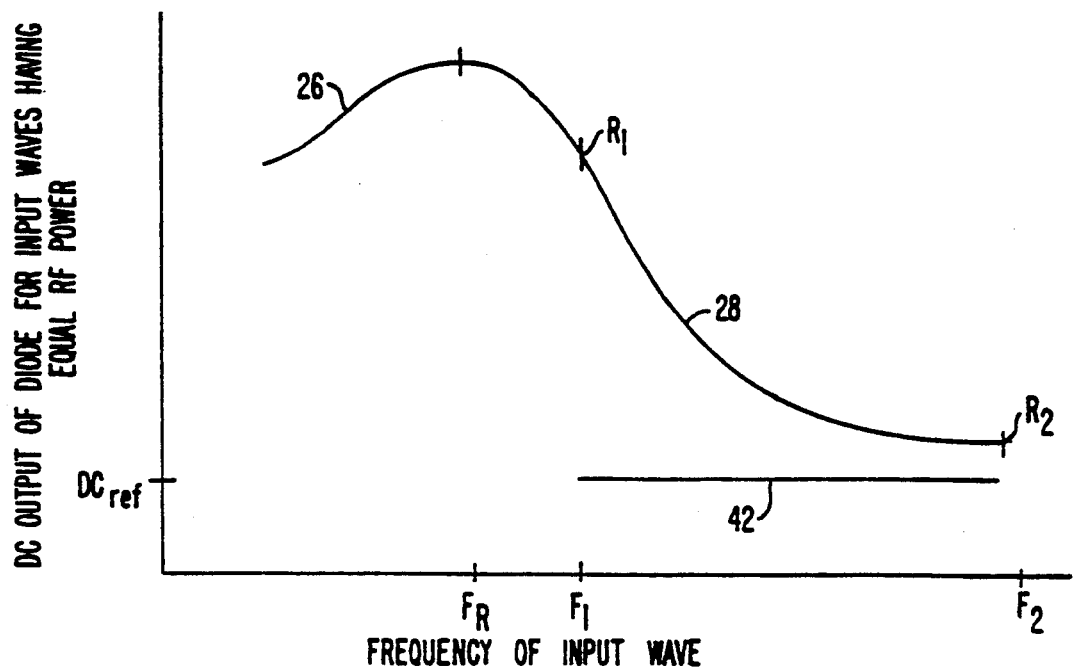
FIG. 5 is an enhanced view of curves 26 and 28 shown in FIG. 3 to more clearly illustrate the purpose of the conditioning means of the invention.

The sensing diode 34 of the invention may be any of a number of typical sensing diodes currently used as power sensors. A qualitative plot of the DC output of these typical diodes versus the frequency of the input waves is shown in FIG. 3 for input waves having the same RF power but different frequencies. FIG. 5 provides an enhanced view of the curve portions 26 and 28 of FIG. 3. According to FIG. 5, input waves having frequencies near and above the resonant frequency $F_R$ of the diode cause the diode to output DC signals which differ depending upon the frequency of the input wave. In other words, the ratio of the DC output of the diode to the power of the input wave (hereinafter referred to as the DC output/power input ratio) is frequency dependent. For example, the DC output/power input ratio $R_1$ for the frequency $F_1$ is larger than the ratio $R_2$ for the frequency $F_2$. This frequency dependence is quite undesirable because the diode is a power sensor, not a frequency sensor. Input waves having the same RF power should cause the diode to output the same DC signal regardless of the frequency of the input wave. It is precisely for this reason that diodes have not been used effectively in the past as power sensors for frequencies near and above the resonant frequency of the diode.

Conditioning Means

The conditioning means 30 of the invention serves a number of different purposes but none more important than that of offsetting the frequency dependence of the sensing diode 34. This is accomplished by designing the conditioning means 30 to vary the fraction (hereinafter referred to as the transmission factor) of the power of the input wave 36 transmitted to the sensing diode depending upon the DC output/power input ratio of the diode for a particular frequency. To elaborate, for frequencies where the DC output/power input ratio is below a reference value, the conditioning means sends a relatively large fraction of the input wave power to the sensing diode. For frequencies where the DC output/power input ratio is above a reference value, the conditioning means transmits a lesser fraction of the input wave power to the sensing diode. By varying the transmission factor of the conditioning means, the DC output level of the diode for input waves having equal powers but different frequencies may be kept nearly constant over a wide frequency range.

Figure 1:
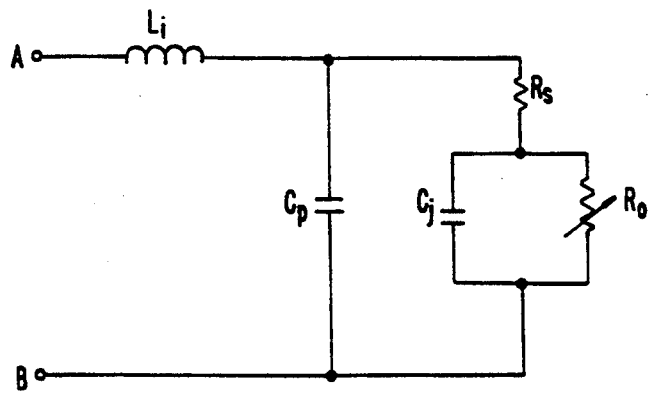
FIG. 1 is a circuit diagram of a commonly accepted model of a sensing diode constructed on a semiconductor substrate.
Figure 2:
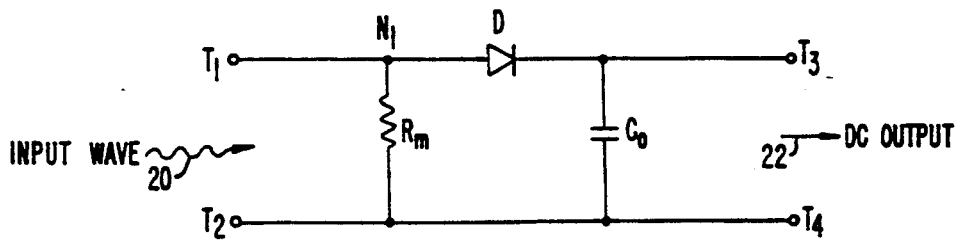
FIG. 2 is a diagram of a prior art power sensing circuit comprising a matched load and a sensing diode.
Figure 6:
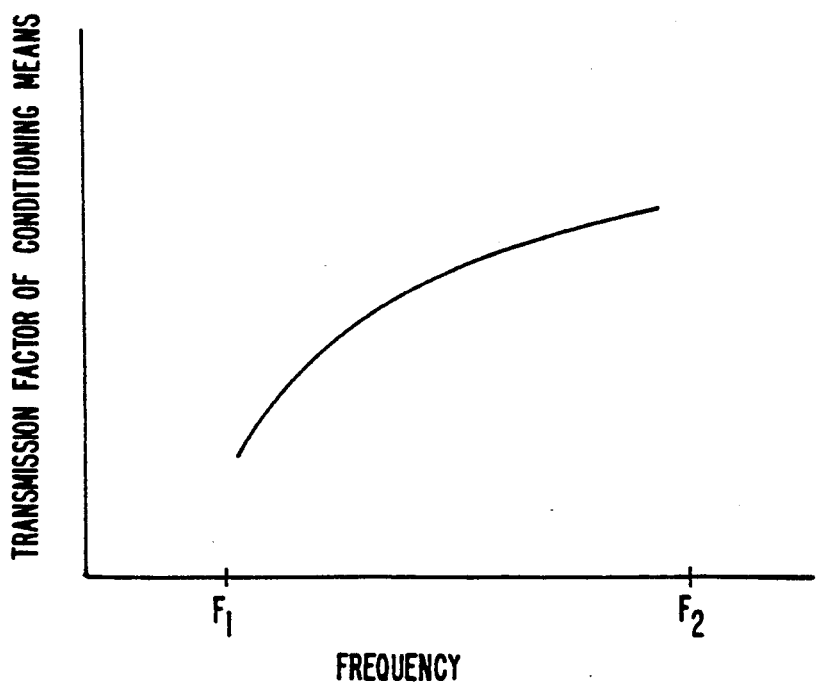
FIG. 6 is a depiction of the desired frequency curve of the conditioning means of the invention above the diode's resonant frequency.

To illustrate this more clearly, reference is made to FIGS. 4 and 5. Suppose that an RF wave having a frequency $F_1$ is conveyed to the power sensor 29. According to FIG. 5, the DC output/power input ratio $R_1$ for this frequency is relatively large. Therefore, a relatively small fraction of the input wave 36 should be transmitted to the diode 34 so as to cause the diode 34 to output a DC signal having a magnitude approximately equal to $DC_{ref}$. Suppose instead that another RF wave having the same power as the first but at a frequency of $F_2$ is conveyed to the power sensor 29. For the frequency $F_2$, the DC output/power input ratio $R_2$ is relatively small so that a relatively large fraction of the input wave 36 should be transmitted to the diode 34 to cause the diode to output a DC signal whose magnitude is once again approximately equal to $DC_{ref}$. By properly varying the transmission factor of the conditioning means for each frequency, the diode may be caused to output a fairly constant DC voltage ($DC_{ref}$) over a wide range of frequencies (from $F_1$ to $F_2$). This is illustrated by the line 42 of FIG. 5. In order to accomplish this, the transmission factor of the conditioning means should increase with increasing frequency. A qualitatively plot of the transmission factor of the conditioning means versus frequency is shown in FIG. 6. The slope of the transmission factor curve should be designed to specifically offset the downward sloping response (curve 28 of FIG. 2) of the sensing diode to cause the diode to produce a relatively constant DC output response for input waves having equal power but different frequencies.

In addition to compensating for the frequency dependence of the sensing diode, it is very important that the conditioning means 30 be further adapted to provide a matching load impedance for the input wave. By having a load impedance that matches the characteristic impedance of the input wave, the conditioning means minimizes the reflection of the input wave, thereby, allowing the total power of the input wave to be measured. This, in turn, allows the sensor of the invention to very accurately measure the power of the input wave.

Figure 7:
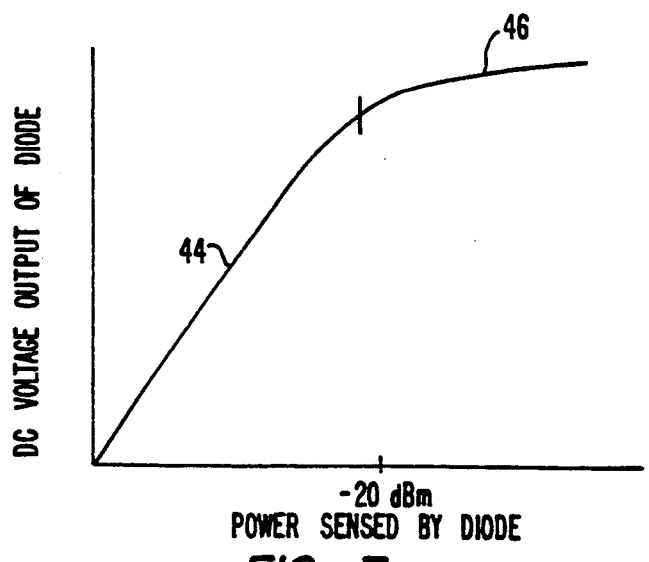
FIG. 7 is a plot of the DC output of a typical sensing diode versus RF power input.

Yet another function of the conditioning means is to attenuate the input wave to ensure that the sensing diode functions in the square law region when it senses the conditioned wave. With reference to FIG. 7 which shows a plot of the voltage output of the diode versus the RF power sensed by the diode, the diode has a linear region 44 of operation and a non-linear region 46 of operation in power terms. In terms of voltage, the linear region 44 is referred to as the square law region because the DC output of the diode in this region is directly proportional to the RF power sensed by the diode. Beyond an RF power of approximately −20 dBm, however, the diode begins to saturate and its output voltage no longer linearly follows the input RF power. To ensure that the diode functions within the linear region, the conditioning means 30 of the invention preferably attenuates the input wave to such a degree that the conditioned wave sensed by the diode has an RF power of −20 dbm or less.

Waveguide

The waveguide 32 of the invention is preferably a tapered, open-ended, rectangular transmission line with a larger impedance at the input port than at the output port. The impedance of the transmission line is reduced from the input port to the output port by tapering the height of the transmission line but leaving the width unchanged. The impedance of the waveguide at the open output port should be sufficiently small compared to the impedance of free space such that the transition from the waveguide to free space is sufficiently abrupt to create a virtual open circuit. This open circuit causes the conditioned wave to have a voltage maximum at the output end of the waveguide, and this voltage maximum occurs there regardless of the frequency of the conditioned wave. The physical dimensions of the open output port of the waveguide, specifically the height, also make it possible to install the diode while minimizing the parasitic effects of its connections.

Figure 8:
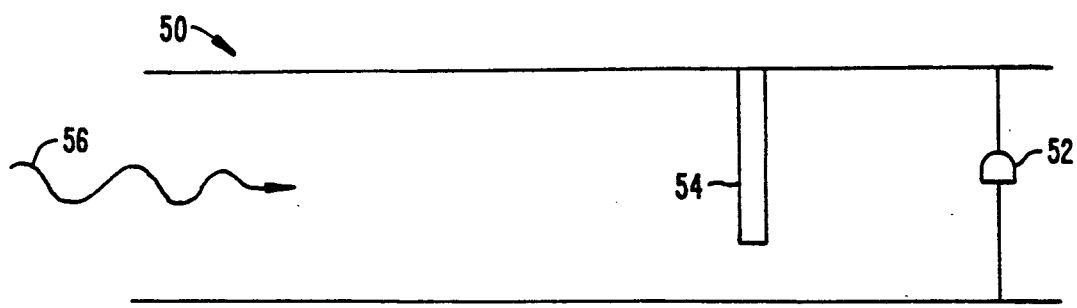
FIG. 8 is an illustration of a prior art waveguide which attempted to place the sensing diode at a position along the waveguide at which a voltage maximum of the input wave occurred.

This is in sharp contrast to the waveguides used in prior art power sensors. A cross-sectional view of one such waveguide is shown in FIG. 8 wherein the rectangular waveguide 50 has a sensing diode 52 and a tuning element 54 attached thereto. The sensor of FIG. 8 operates in a useful manner only at one frequency, or, at most, over a very narrow range of frequencies centered around the frequency for which the tuning element is adjusted. As the frequency of the input wave changes, in order to measure the power associated with it the tuning element must be re-adjusted and furthermore, the sensor must be recalibrated. This process can be quite tedious and impractical, especially if the frequency of the input wave 56 is frequently changed.

In sharp contrast, the waveguide of the present invention creates a virtual open circuit at the output port of the waveguide, which in turn causes a voltage maximum of the input wave 56 to always appear there regardless of the frequency of the input wave. Therefore, overall sensor sensitivity is kept at a maximum. Additionally, the match that the diode and the output waveguide port present to the conditioned wave is irrelevant to the match of the sensor, which is solely determined by the conditioning means 30 of FIG. 4. As a result, the sensor 29 of the invention may be used to effectively measure the power of input waves over the full nominal frequency band of the standard waveguide to which it is connected.

Thus far, only the general specifications and requirements of the elements of the invention have been disclosed. To more clearly illustrate the invention, a specific implementation of the invention will now be discussed.

Specific Implementation

It is the goal of this specific example to provide an RF power sensor which is capable of accurately sensing the RF power of waves having frequencies way above 60 GHz, e.g., between 75 and 110 GHz.

Sensing Diode

Figure 9:
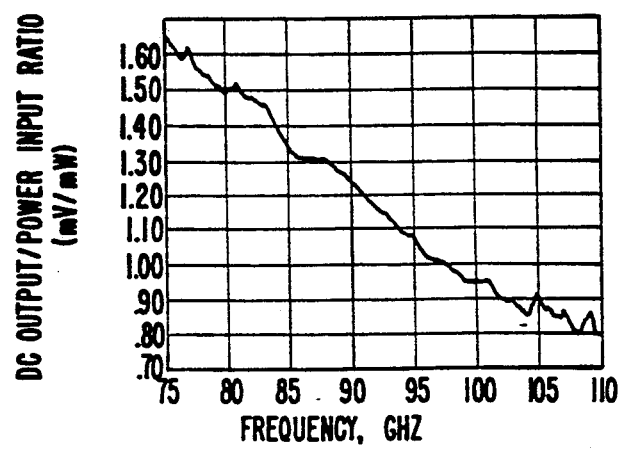
FIG. 9 is a plot of the DC output/power input ratio of the sensing diode used in the specific implementation of the invention.

The sensing diode used in this example is a typical low barrier solid state diode which has a resonant frequency of approximately 60 GHz. A plot of the DC output/power input ratio of this diode versus frequency is shown in FIG. 9. From FIG. 9, it is clear that the DC output/power input ratio of the diode falls off significantly with increasing frequency. The input mismatch of such a sensor is also severe. This is to be expected since the frequency range of interest is significantly above the resonant frequency of the diode.

Directional Coupler

As previously discussed, the conditioning means of the invention serves three major purposes: (1) offsetting the frequency dependence of the sensing diode; (2) providing a matching impedance for the input wave; and (3) attenuating the input wave sufficiently to ensure that the sensing diode operates within the square law region. These functions are preferably implemented through the use of a properly designed directional coupler but not restricted to the use of such couplers (other circuits will also work). Before describing the directional coupler of the invention, however, a general discussion on directional couplers is first necessary.

Figure 10:
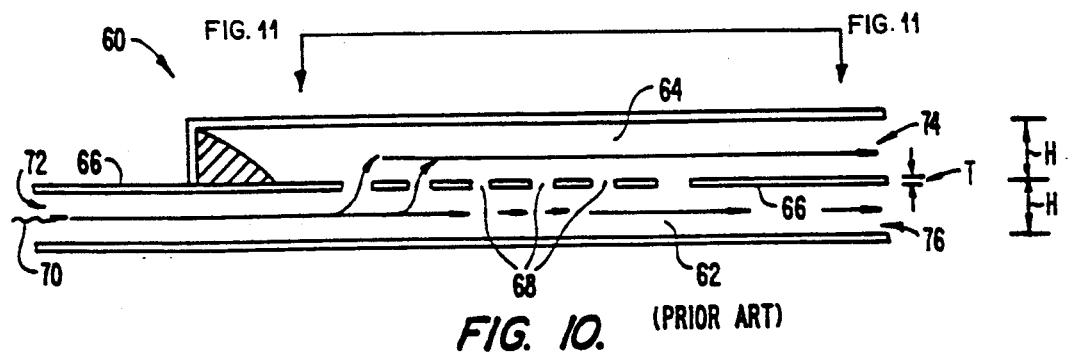
FIG. 10 is a cross sectional view of a prior art directional coupler used as a signal separator and sampler.

A cross sectional view of a typical directional coupler is shown in FIG. 10 wherein the coupler 60 comprises a main waveguide 62 and an auxiliary waveguide 64, the two waveguides 62, 64 being separated from each other by a conductive wall 66 having a thickness T. An input wave 70 may enter the coupler 60 through the main input port 72 of the main waveguide 62 and propagate through the main waveguide 62 to the main output port 76. The holes 68 in the separating wall 66 allow a portion of the input wave 70 to enter the auxiliary waveguide 64 and propagate through to the auxiliary output port 74. Because coupler 60 separates the input signal 70 into more than one output signal, directional couplers like coupler 60 are usually used as signal separators and samplers.

Figure 11:
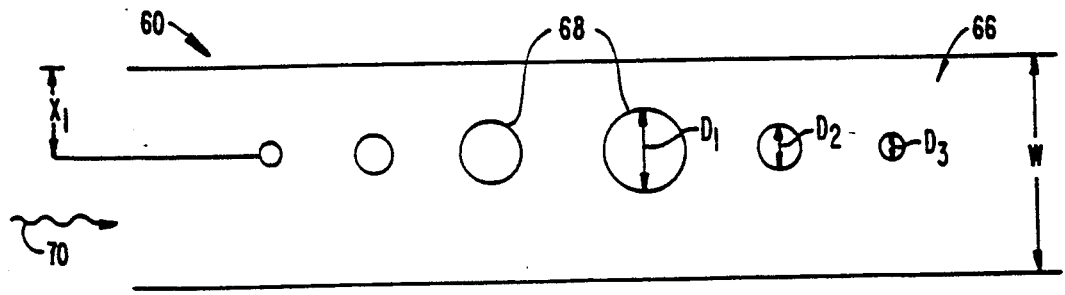
FIG. 11 is a top cross sectional view of the prior art directional coupler shown in FIG. 10.

With reference to FIG. 11, which provides a top cross sectional view of the coupler of FIG. 10, the separating wall 66 of the coupler 60 contains a plurality of holes 68 which allow portions of the input wave 70 to enter and propagate through the auxiliary waveguide 64 (FIG. 10). The fraction of the wave 70 that enters the auxiliary waveguide 64 is defined as the coupling coefficient of the coupler 60 and usually varies with the frequency of the input wave 70. Directional couplers using multiple hole coupling are known. See "A Precision Directional Coupler Using Multi-Hole Coupling," by Barnett et al., Hewlett-Packard Journal, Vol. 3, No. 78, March–April 1952.

With reference to FIGS. 10 and the coupling coefficient of the coupler 60 is a function of the following parameters: (1) the number of holes 68 and the diameter D of each of the holes 68 in the separating wall 66; (2) the thickness T of the separating wall 66; (3) the distance $X_1$ between the side of the coupler 60 and the center of the holes 68; (4) the width W of the coupler 60; (5) the height H of the main and auxiliary waveguides 62, 64; and (6) the wavelength $\lambda_g$ of the input wave 70 within the waveguides 62 and 64. The magnitude of the coupling coefficient for each of the holes 68 in the separating wall 66 may be expressed by the following equation:

$$|A| = \frac{C}{1 - \left(\frac{KD}{2\lambda}\right)^2} \cdot \frac{W}{2H} F\left(\frac{D}{W}, \frac{T}{W}\right) G\left(\frac{X_1}{W}, \frac{T}{D}\right) H\left(\frac{L}{\lambda_g}\right)$$

where $$F = \frac{4\pi}{3}\left(\frac{D}{2W}\right)^3 e^{-1.841\frac{2T}{D}}$$

$$G = 4(1-R)\frac{2W}{L}\sin^2\left(\frac{\pi x_1}{W}\right)$$

$$H = \frac{1}{2}\left(\frac{L}{\lambda_g} + \frac{\lambda_g}{L}\right)$$

$$L = 2W\sqrt{\frac{1-R}{\cot^2\left(\frac{\pi X_1}{W}\right) - R}}$$

and $$R = \frac{1}{2}e^{-.564\frac{2T}{D}}$$

For most typical couplers, the constant C ranges from 0.87 to 0.98 and the constant K ranges from 2.8 to 3.9. The coupling coefficient of the entire coupler 60 may be obtained by summing up the coupling coefficients of each of the individual holes 68.

Figure 12:
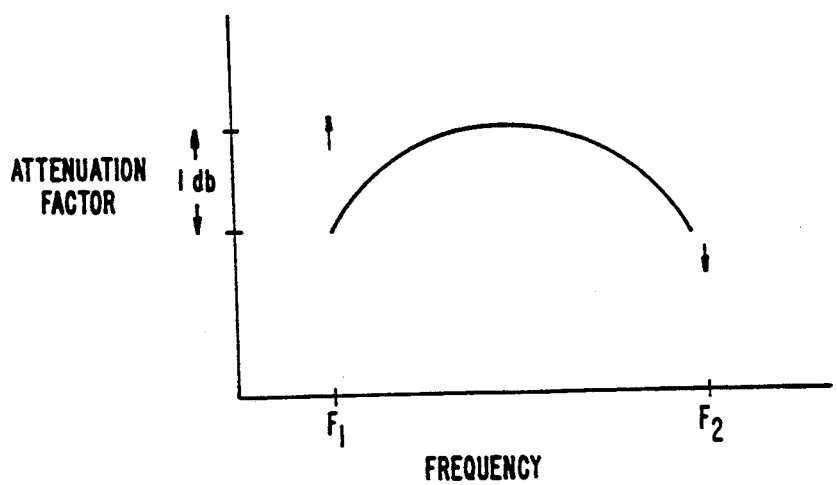
FIG. 12 is a qualitative representation of the frequency response of a typical prior art directional coupler.

The attenuation and frequency characteristics of a typical directional coupler is that shown in FIG. 12 wherein the attenuation versus frequency curve takes on a bell-like shape. The attenuation factor of the coupler has a maximum around the middle of the operative frequency range of the coupler with a swing between the maximum and the minimum attenuation being within a 1 dB window.

Although there are six parameters which affect the coupling coefficient of the coupler 60, there are three which are of particular significance. These parameters are the number of holes 68 and the diameters of the holes 68 (FIG. 10), the thickness T of the separating wall 66 (FIG. 9), and the distance $X_1$ (FIG. 10). The attenuation factor of the coupler is mostly affected by the diameters of the holes 68 and the thickness of the separating wall 66, while the frequency shaping of the coupler is mainly determined by the distance $X_1$ between the center of the holes 66 and the side of the coupler 60. By making the other parameters constant and by only manipulating these three parameters, a coupler may be designed which meets the specifications for the conditioning means of the invention.

With reference to FIG. 12, the frequency response of a typical directional coupler clearly does not meet the specifications of the conditioning means of the invention. Instead of having a bell-like shape, the directional coupler of the invention should have an attenuation versus frequency curve which resembles that depicted in FIG. 13. The bell-like shape of the coupler's frequency response may be altered, however, by adjusting the distance $X_1$ (FIG. 10). As shown in FIG. 12, a proper adjustment in $X_1$ will pull the attenuation factor at frequency $F_1$ up and push the attenuation factor at frequency $F_2$ down so that the coupler's frequency curve takes on a shape which does resemble that shown in FIG. 13.

Figure 13:
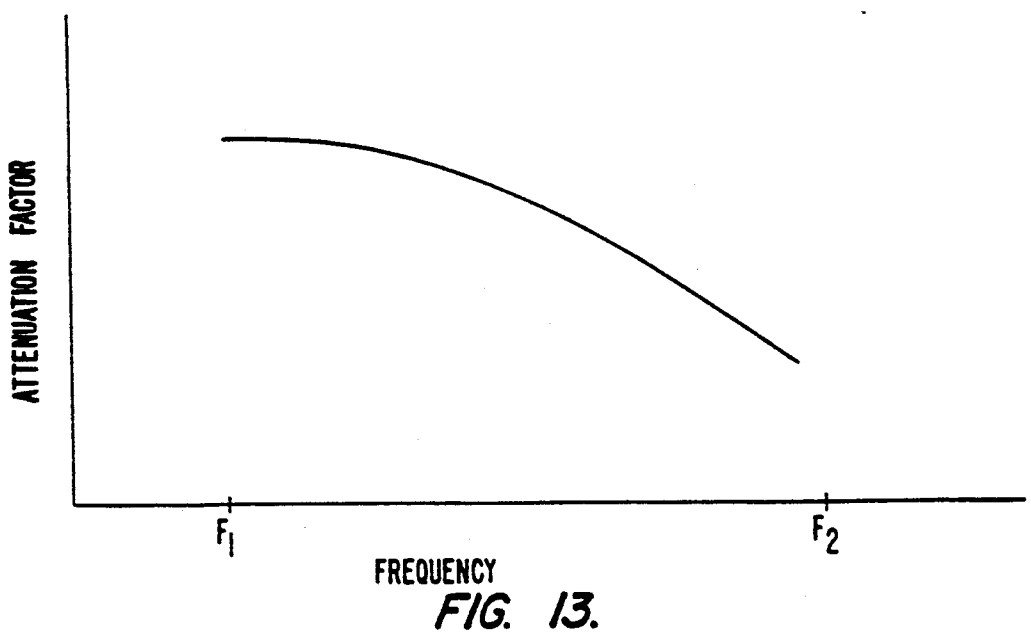
FIG. 13 is a qualitative representation of the desired frequency response of the coupler of the specific implementation.

At first glance, it may seem that the desired attenuation/frequency curve should be one that slopes upward, not downward as depicted in FIG. 13. It is true that the curves in FIGS. 6 and 13 do not seem to agree at first but they actually are conveying the same message. With reference to FIG. 13, as the frequency increases, the attenuation factor of the coupler decreases. That is, as the frequency of the input wave increases, a greater fraction of the input wave is being transmitted by the coupler. Therefore, the transmission factor of the coupler increases with frequency just as is depicted in FIG. 6. Thus, in essence, the curves in FIGS. 6 and 13 are equivalent.

With all of these factors in mind, the directional coupler of this specific implementation was designed as follows:

(1) thickness T of the separating wall=0.254 mm (millimeters);
(2) five pairs of holes were placed in the wall with the diameters of these holes being 0.311, 0..294, 0..262, 0.218, and 0.166 mm;
(3) the distance $X_1$=0.665 mm;
(4) the height H of the main and auxiliary waveguides=1.270 mm; and
(5) the width W of the coupler=2.540 mm.

Figure 14:
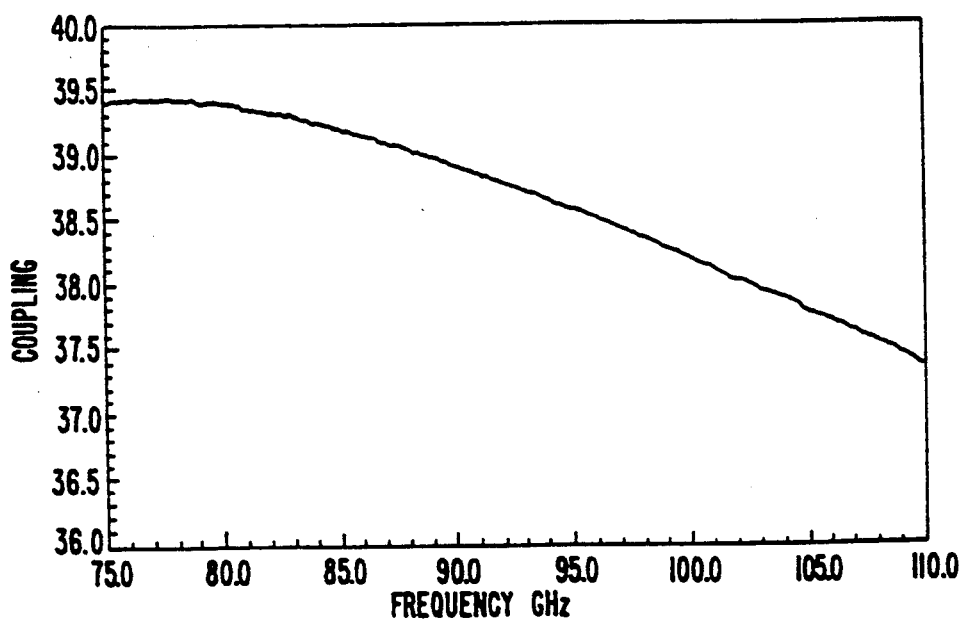
FIG. 14 is a quantitative plot of the actual frequency response of the directional coupler of the specific implementation to illustrate the invention.

A plot of the attenuation factor versus frequency of a directional coupler having these values is shown in FIG. 14. This directional coupler does indeed have the desired frequency characteristics.

Figure 15:
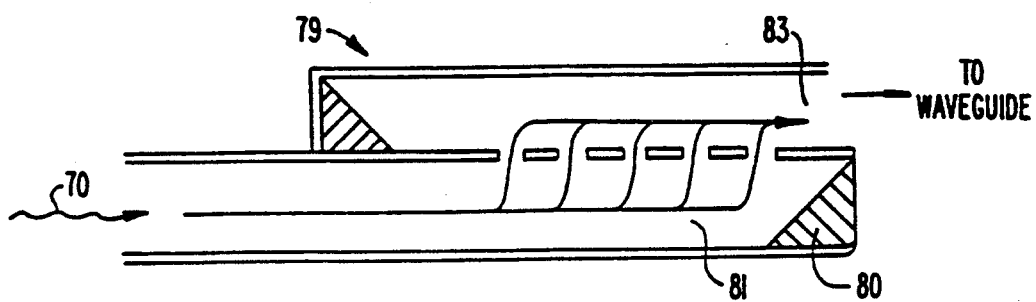
FIG. 15 is a cross sectional view of the directional coupler of the specific implementation emphasizing the load of the coupler having an impedance which matches the characteristic impedance of the input wave.

As thus far designed, the directional coupler satisfies two of the three criteria of the conditioning means, namely the attenuation and the frequency dependence compensation criteria. The third criterion still to be met is the impedance matching criterion. This is easily accomplished, however, as shown by FIG. 15. Instead of leaving the output port 76 of the main waveguide 62 open as shown in FIG. 10, the main waveguide of the directional coupler 79 of this implementation is terminated with a load 80 having an impedance which is substantially equal to the characteristic impedance of the input wave. As far as the input wave 70 is concerned, when it propagates into the main waveguide 81, it encounters a matched load 80. As a result, very little of the input wave 70 is reflected and this, in turn, allows the power of the wave to be sensed more accurately. With the main waveguide terminated with a matching load, the directional coupler only has one output port, the auxiliary output port 83. Thus, it is this port which transmits the conditioned wave to the waveguide.

Waveguide

Figure 16:
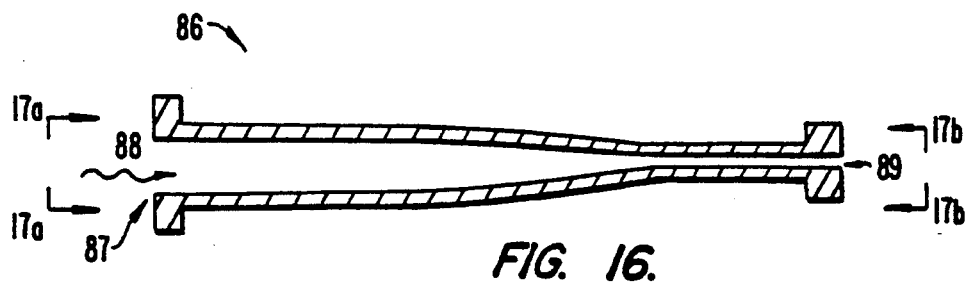
FIG. 16 is a cross sectional of the tapered waveguide of the specific implementation to illustrate the invention.
Figure 17A:
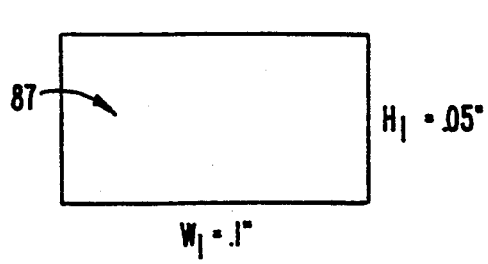
FIG. 17a is a frontal view of the input port of the waveguide of FIG. 16 showing the dimensions of the input port.
Figure 17B:
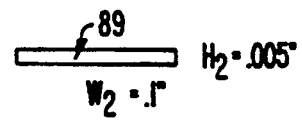
FIG. 17b is a frontal view of the output port of the waveguide of FIG. 16 showing the dimensions of the output port.
Figure 18:
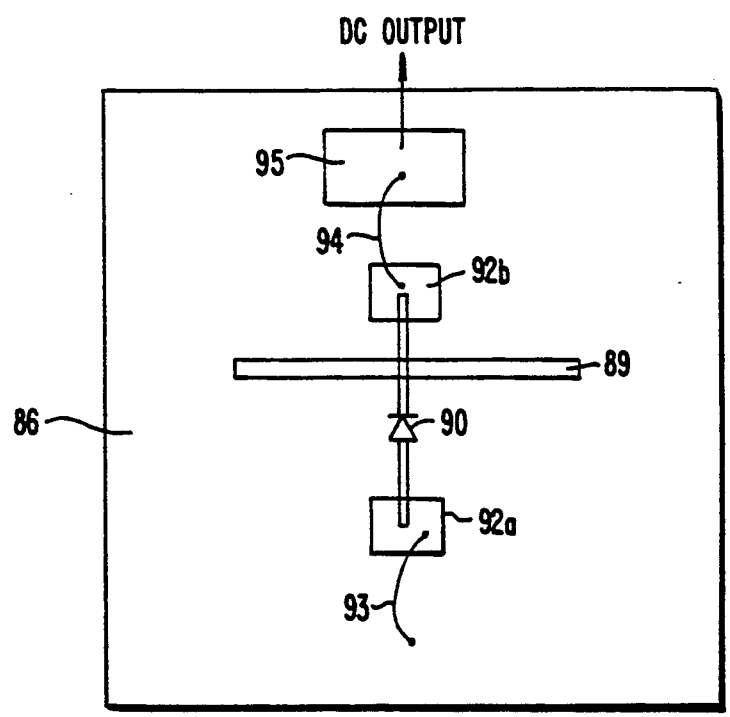
FIG. 18 is an illustration showing the sensing diode attached to the output port of the waveguide of the specific implementation to illustrate the invention.

It was previously mentioned that the waveguide should be tapered to reduce the height of the output port so that the impedance at the input port is larger than the impedance at the output port. Such a waveguide is shown in FIG. 16 wherein the waveguide 86 has an input port 87 for receiving a conditioned wave 88 and an output port 89 for transmitting an output wave. With reference to FIGS. 17a and 17b, the input port 87 has a width W equal to about 0.100 inches and a height of about 0.05 inches. In contrast, the output port 89 has the same width $W_1$ as the input port 87 but a height $H_2$ of only about 0.005 inches. The reduced height of the output port 89 significantly reduces its impedance. Thus, when the wave 88 propagates to the output end 89 of the waveguide 86, it encounters a sudden and tremendous impedance difference between the small impedance of the output port 89 and the relatively large impedance of free space. As a result, a virtual open circuit exists at the output port/free space boundary. Because of the open circuit, a voltage maximum of the wave 88 will always appear at the output port 89 of the waveguide regardless of the frequency of the wave. Because this is true and because it is preferable for the sensing diode to sense the wave 88 at a voltage maximum of the wave 88, the sensing diode of this implementation should be connected across the output port 89 of the waveguide 86 as shown in FIG. 18. This configuration also reduces the parasitic effects of the diode connections to a minimum.

With reference to FIG. 18, the sensing diode 90 is mounted across the open output port 89 of the waveguide 86 with each of the diode terminals attached to a corresponding MIS capacitor 92a and 92b (approximately 2 pF). A wire 93 connects capacitor 92a to the waveguide 86 to ground one of the terminals of the diode 90. Another wire 94 connects the output terminal of the diode 90 to a filtering capacitor 95 (approximately 1000 pF) to allow the DC output of the diode to be taken from the filtering capacitor 95. Being thus attached, the sensing diode 90 will always sense the power of the wave 88 at a voltage maximum regardless of the frequency of the wave 88. Therefore, the diode 90 may be used to sense the RF power of electromagnetic waves over a broad frequency band.

Complete Power Sensor

Figure 19:
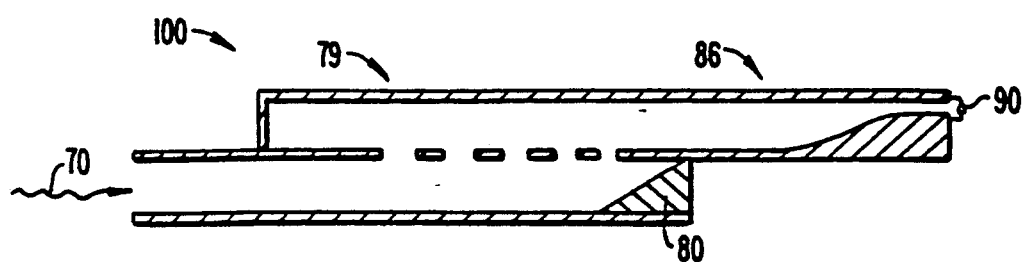
FIG. 19 is an illustration of the overall power sensor of the specific implementation of the invention to illustrate the invention.
Figure 20:
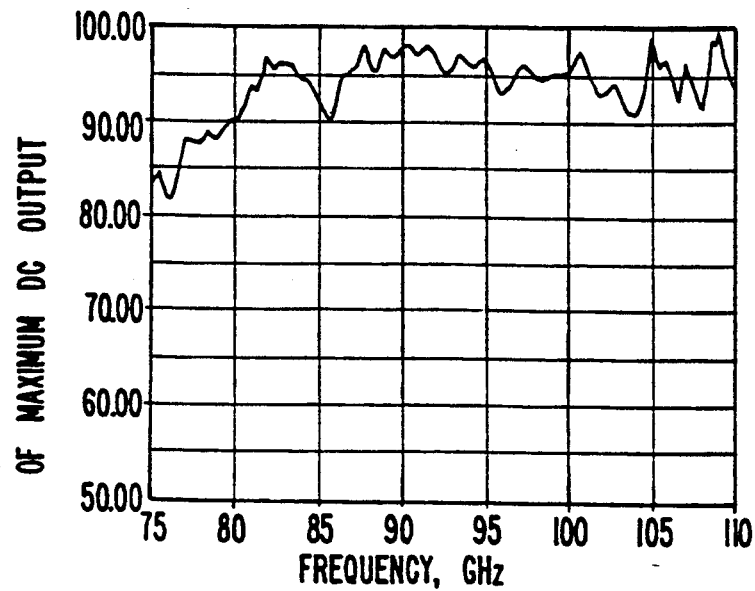
FIG. 20 is a normalized quantitative plot of the frequency response of the power sensor of FIG. 19 to illustrate the relatively flat frequency response of the power sensor of the specific implementation of the invention.

With all of the elements properly designed, the overall power sensor may now be assembled as shown in FIG. 19 wherein the sensor 100 comprises the directional coupler 79, and the tapered waveguide 86 with the sensing diode 90 attached to its output port. The DC output versus frequency response of this sensor is shown in FIG. 20. The plot of FIG. 20 is normalized by dividing all of the DC output values by the maximum DC output value. Thus, the values on the vertical axis are percentages of the maximum DC output value. From FIG. 20, it can be seen that the frequency response of the overall power sensor is indeed relatively flat over the entire frequency band from 75 Ghz to 110 GHz.

It should be noted at this point that the plot of FIG. 20 is the calibration curve for a sensor of this invention. It reduces to a minimum the errors due to sensor lack of absolute flatness as a function of frequency, as is customary in the art. As long as the frequency of the input wave can be ascertained, which is normally the case, the apparatus of the invention may be used effectively to sense the power of electromagnetic waves having frequencies near and above the resonant frequency of the sensing diode.

Figure 21:
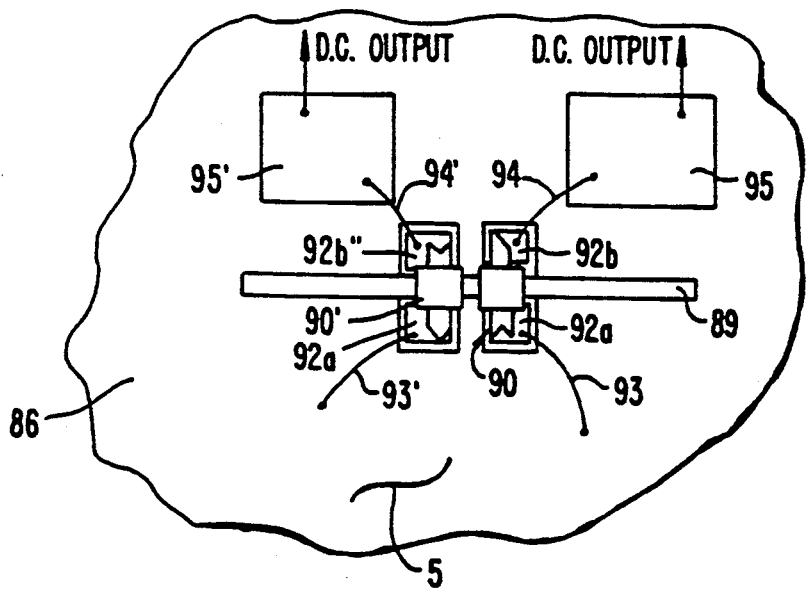
FIG. 21 is an illustration showing two sensing diodes whose terminals of opposite polarity are connected to the output port of the waveguide of an alternative implementation to illustrate the invention.
Figure 22:
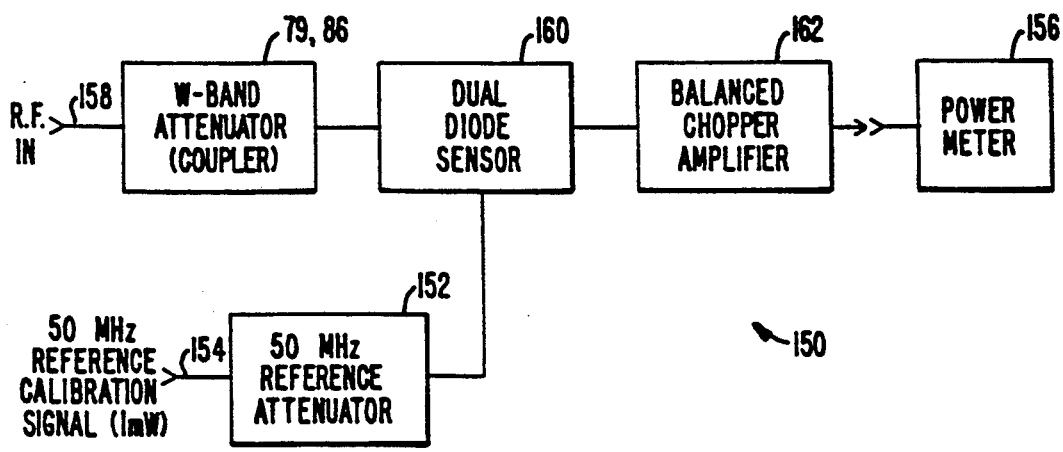
FIG. 22 is a block diagram of a power sensor, where the sensor may be calibrated for accurate measurement.

FIG. 21 is an illustration showing two sensing diodes whose terminals of opposite polarity are connected to two output ports of the waveguide of an alternative embodiment to illustrate the invention. To simplify the description, identical components are labeled with the same numerals. As known to those skilled in the art, thermal effects on the sensing diodes such as diode 90 in FIG. 19 may cause the DC output voltage of the diode to be in error. To compensate for such thermally induced errors, an additional sensing diode 90' is employed as shown in FIG. 21, where the second diode is also connected across the open end of the output port 89 of the waveguide 86. In the manner similar to connecting the arrangement for sensing diode 90, a wire 93' connects capacitor 92a' to the waveguide 86 to connect to ground one of the terminals of the diode 90'. Another wire 94' connects the output terminal of the diode 90' to a filtering capacitor 95' (again approximately 1,000 pF) to allow the DC output of the diode to be taken from the filtering capacitor 95'. As shown in FIG. 21, the positive terminal of diode 90 is connected by wire 94 to capacitor 95 whereas for diode 90', the negative terminal is connected by wire 94' to filtering capacitor 95'. The two outputs at capacitors 95, 95' are then both fed to a balanced chopper amplifier as shown in FIG. 22. In this manner, error voltages caused by thermal effects on the sensing diodes are cancelled.

FIG. 22 is a block diagram of a power sensor to illustrate another embodiment of the invention. As shown in FIG. 22, power sensor 150 includes a 50 MHz reference attenuator 152 which has a reference calibration signal input 154. Because of variations in the gain and sensitivity of the different components in a power sensor 150, in order for power meter 156 to provide an accurate measurement, the power sensor 150 is preferably first calibrated before the power measurement is taken. For this purpose, when no signal is fed to the RF input 158, a reference calibration signal such as one at 50 MHz at 1 milliwatt is applied to reference input 154. The two outputs of the dual diode sensors 90, 90' are fed to the balanced chopper amplifier 162 where the amplified diode power output is read by power meter 156 for the purpose of calibrating the meter. Typically, the gain of the meter is adjusted so that the power reading is at a given level such as 1 milliwatt corresponding to a 50 MHz input reference calibration signal at input 154. The power sensor 150 is then ready to be used for measuring a radio frequency signal of an unknown frequency applied to input 158. Hewlett-Packard Company of Palo Alto, Calif., the assignee of this application, provides many instruments which provide a 50 MHz calibrating signal where the instruments have also been measured in the factory for various offsets and other frequencies by reference to a 50 MHz reference signal. The above-described power sensor 150 is therefore particularly convenient when used in conjunction with such instruments. For a description of the performance and design of power sensors provided by Hewlett-Packard Company, see "Design and Performance of Millimeter-Wave Thermocouple Sensors," by Lee H. Colby, Hewlett-Packard Journal, pp. 35-37, April 1988.

Figure 23:
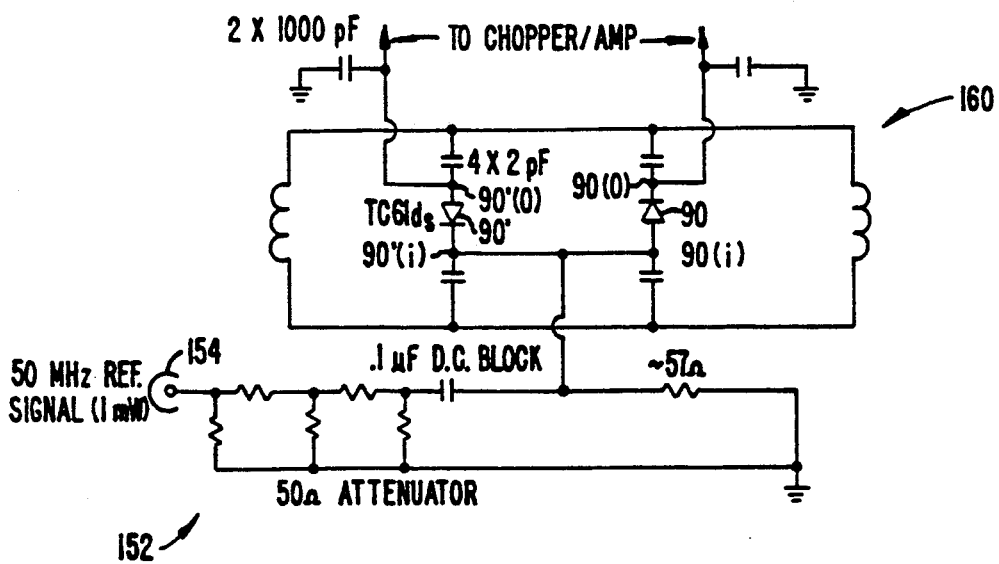
FIG. 23 is a schematic circuit diagram illustrating in more detail the dual diode sensor and reference attenuator of FIG. 22.

FIG. 23 is a schematic circuit diagram illustrating in more detail the dual diode sensor 160 and the reference attenuator 152 of FIG. 22. As shown in FIG. 23, diode 90 has an input 90(i) and an output 90(o). Diode 90' has an input 90'(i) and an output 90'(o). As shown in FIG. 23, the reference attenuator 152 connects reference input 154 to the two inputs of the two diodes 90, 90', where the outputs of the two diodes are connected to the balanced chopper amplifier shown in FIG. 22. In this manner, a reference calibration signal applied to input 154 will be sensed by both diodes which provide outputs to the balanced chopper amplifier and measured by power meter 156 as described above.

Although the invention has been described with reference to a specific example, it should not be construed to be so limited. Many modifications may be made by one skilled in the art with the benefit of this disclosure without departing from the spirit of the invention. For example, the conditioning means need not be implemented with a directional coupler. Implementations using other means are possible. This and other modifications are well within the scope of the invention. Thus, the invention should not be limited by the examples used to illustrate it but only by the scope of the appended claims.

What is claimed is:

1. An apparatus for sensing the power of an input electromagnetic wave having a frequency within a predetermined range, said apparatus comprising:
   a diode for indicating the power of said input wave by outputting a DC signal having a magnitude proportional to the power of said input wave, said diode having a specified frequency at which it resonates, said diode also having frequency characteristics such that when the frequency of an electromagnetic wave applied to said diode is near or above said resonant frequency, the ratio of the DC output of said diode to the power of said wave applied to said diode, is dependent upon the frequency of said wave applied to said diode;
   an input wave conditioning means for counteracting the frequency dependence of said diode for frequencies near and above said resonant frequency, said conditioning means forming from said input wave a conditioned wave whose power is a fraction of the power of said input wave, wherein said fraction at frequencies where said ratio is below a reference value is greater than the fraction at frequencies where said ratio is above a reference value, such that for input waves having equal power but different frequencies, said conditioning means causes said diode to output DC signals having substantially equal magnitudes; and
   a waveguide, having an input port and an open-ended output port, said waveguide having a larger impedance at the input port than at the output port, the impedance of the output port of said waveguide is smaller to such an extent than the impedance of free space that a virtual open circuit is provided at the output port/free space boundary, said waveguide receiving said conditioned wave and transmitting said conditioned wave to said diode.

2. The apparatus of claim 1 wherein said diode is connected to said waveguide at said output port of said waveguide where a voltage maximum of said conditioned wave occurs.

3. The apparatus of claim 2 wherein said waveguide is a rectangular waveguide.

4. The apparatus of claim 3 wherein said diode is connected across the open end of the output port of said waveguide.

5. The apparatus of claim 4, further comprising a second diode connected across the open end of the output port of said waveguide in the power output means, each diode having a positive and a negative terminal, wherein the positive terminal of one of the two diodes and the negative terminal of the remaining diode are connected to the output means to reduce thermally induced errors.

6. The apparatus of claim 5, said apparatus further comprising a reference attenuator connected to the terminals of the diodes that are not connected to said output means, said attenuator having a reference signal input.

7. An apparatus for sensing the power of an input electromagnetic wave having a frequency within a predetermined range, said apparatus comprising:
   a diode for indicating the power of said input wave by outputting a DC signal having a magnitude proportional to the power of said input wave, said diode having a specified frequency at which it resonates, said diode also having frequency characteristics such that when the frequency of an electromagnetic wave applied to said diode is near or above said resonant frequency, the ratio of the DC output of said diode to the power of said wave applied to said diode, is dependent upon the frequency of said wave applied to said diode;
   a directional coupler with two branches for counteracting the frequency dependence of said diode for frequencies near and above said resonant frequency by forming from said input wave a conditioned wave having a fraction of the power of said input wave, wherein said fraction at frequencies where said ratio is below a reference value is greater than the fraction at frequencies where said ratio is above a reference value, such that for input waves having equal power but different frequencies, said directional coupler causes said diode to output DC signals having substantially equal magnitudes; and
   a waveguide, having said diode connected thereto, for receiving said conditioned wave and transmitting said conditioned wave to said diode.

8. The apparatus of claim 7 wherein one of said two branches of said directional coupler is terminated in a load impedance which matches the characteristic impedance of the input wave.

9. The impedance of claim 7 wherein said conditioned wave formed by said directional coupler is of a sufficiently low power to ensure that said diode operates within a predetermined power range where the DC output of said diode is linearly proportional to the power of said input wave.

* * * * *

UNITED STATES PATENT AND TRADEMARK OFFICE
CERTIFICATE OF CORRECTION

PATENT NO. : 5,204,614

DATED : April 20, 1993

INVENTOR(S) : Pedro A. Szente, Gratz L. Armstrong

It is certified that error appears in the above-identified patent and that said Letters Patent is hereby corrected as shown below:

Column 8, line 55, change "and the" to --and 11, the--;

Column 10, line 31, change "the wall" to --the separating wall--;

Column 10, line 32, change "0..294, 0..262" to --0.294, 0.262--;

Column 11, line 4, change "W" to --$W_1$--.

Signed and Sealed this

Twelfth Day of April, 1994

*Attest:*

BRUCE LEHMAN

*Attesting Officer*

Commissioner of Patents and Trademarks